(12) United States Patent
Wang et al.

(10) Patent No.: US 11,670,443 B2
(45) Date of Patent: Jun. 6, 2023

(54) LIQUID COOLED INDUCTOR VIA NOZZLE SPRAY

(71) Applicant: Ford Global Technologies, LLC, Dearborn, MI (US)

(72) Inventors: Fan Wang, Novi, MI (US); Lihua Chen, Farmington Hills, MI (US); Serdar Hakki Yonak, Ann Arbor, MI (US); John P. Casci, Westland, MI (US); Abdullahi M. Hajiabdi, Dearborn, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 785 days.

(21) Appl. No.: 16/687,185

(22) Filed: Nov. 18, 2019

(65) Prior Publication Data
US 2021/0151236 A1 May 20, 2021

(51) Int. Cl.
| | |
|---|---|
| *H01F 27/10* | (2006.01) |
| *H01F 27/32* | (2006.01) |
| *H01F 27/06* | (2006.01) |
| *H05K 7/20* | (2006.01) |
| *B60L 50/60* | (2019.01) |
| *B60K 6/22* | (2007.10) |

(52) U.S. Cl.
CPC ............. *H01F 27/10* (2013.01); *H01F 27/06* (2013.01); *H01F 27/325* (2013.01); *H05K 7/20272* (2013.01); *H05K 7/20872* (2013.01); *H05K 7/20927* (2013.01); *B60K 6/22* (2013.01); *B60L 50/60* (2019.02); *B60L 2210/12* (2013.01); *B60L 2210/14* (2013.01); *B60Y 2200/91* (2013.01); *B60Y 2200/92* (2013.01); *B60Y 2306/05* (2013.01)

(58) Field of Classification Search
CPC ......... H01F 27/10; H01F 27/06; H01F 27/325
USPC .......................................................... 336/57
See application file for complete search history.

(56) References Cited

U.S. PATENT DOCUMENTS

| | | | |
|---|---|---|---|
| 7,212,406 B2 * | 5/2007 | Kaishian ................. | H01F 27/10 165/80.4 |
| 9,441,725 B2 | 9/2016 | Dobbins et al. | |
| 9,961,807 B2 * | 5/2018 | Kawaguchi ........... | H01L 23/473 |

(Continued)

FOREIGN PATENT DOCUMENTS

| | | | |
|---|---|---|---|
| CN | 1887439 A | * | 1/2007 |
| CN | 100408197 C | * | 8/2008 |

(Continued)

*Primary Examiner* — Mang Tin Bik Lian
*Assistant Examiner* — Joselito S. Baisa
(74) *Attorney, Agent, or Firm* — Brooks Kushman P.C.; David B. Kelley

(57) ABSTRACT

A vehicle, a vehicle power electronics assembly, and a method of packaging and cooling an inductor assembly are provided. The vehicle has a vehicle electrical system with a variable voltage converter (VVC) and an inductor assembly. The inductor assembly has a core and a winding. A bobbin is connected to and surrounds an outer perimeter of the inductor assembly. The bobbin defines an inlet, an internal fluid passage, and a series of nozzles. The nozzles in the series of nozzles are spaced apart from one another about the bobbin and are positioned to spray fluid directly onto the winding. A fluid system is connected to the inlet to provide pressurized fluid to the inlet.

19 Claims, 6 Drawing Sheets

(56) References Cited

U.S. PATENT DOCUMENTS

| | | | |
|---|---|---|---|
| 10,083,788 B2* | 9/2018 | Ko | H01F 27/08 |
| 10,141,093 B2 | 11/2018 | Inaba et al. | |
| 10,699,840 B2* | 6/2020 | Sung | H01F 27/402 |
| 11,191,192 B2* | 11/2021 | Takeuchi | H01L 23/4012 |
| 2005/0180106 A1* | 8/2005 | Ohashi | H01L 23/473 |
| | | | 257/E23.098 |
| 2015/0208556 A1* | 7/2015 | Kodama | B60L 53/22 |
| | | | 363/141 |
| 2016/0125996 A1* | 5/2016 | Ko | H01F 27/08 |
| | | | 903/952 |
| 2018/0130591 A1 | 5/2018 | Skalski et al. | |

FOREIGN PATENT DOCUMENTS

| | | | | |
|---|---|---|---|---|
| CN | 206276527 U | * | 6/2017 | B05B 7/0408 |
| CN | 108022726 A | * | 5/2018 | B60K 6/44 |
| CN | 110492663 A | * | 11/2019 | B60K 11/02 |
| DE | 102015203286 A1 | | 9/2015 | |
| DE | 102020130677 A1 | * | 5/2021 | H01F 27/10 |

* cited by examiner

LIQUID COOLED INDUCTOR VIA NOZZLE SPRAY

TECHNICAL FIELD

Various embodiments relate to an inductor assembly for a power converter in a vehicle, and thermal management of the inductor assembly.

BACKGROUND

Electrified vehicles including hybrid-electric vehicles (HEVs), plugin hybrid electric vehicles (PHEVs), and battery electric vehicles (BEVs) rely on a traction battery to provide power to a traction motor for propulsion and a power inverter therebetween to convert direct current (DC) power to alternating current (AC) power. Many electrified vehicles additionally include a DC-DC converter, also referred to as a variable voltage converter (VVC), to convert the voltage of the traction battery to an operational voltage level of the electric machine.

The voltage converter may be a buck-boost converter, with the voltage converter stepping up or increasing ("boosting") the output voltage magnitude in comparison to the input voltage magnitude, or stepping down or decreasing ("bucking") the output voltage magnitude in comparison to the input voltage magnitude. The DC-DC converter includes an inductor assembly, switches and diodes. The inductor assembly may generate heat during operation.

Previously, the inductor assembly has been cooled via indirect liquid cooling by placing it in a housing surrounded by a potting material and thermally connecting the housing to a cooling plate such that the inductor is cooled via conductive heat loss to the cooling plate and convective heat loss to the circulating fluid in the cooling plate. In this example, the fluid does not come into direct contact with the inductor assembly. Alternatively, the inductor assembly is cooled via direct liquid cooling by positioning an uncovered inductor assembly within a transmission case where transmission fluid within the transmission case can splash onto the inductor assembly before draining into the transmission sump; however, cooling of the inductor may be limited in this case when the transmission fluid is not being circulated, e.g. when the vehicle is standing or in park while operating. Additionally, and depending on the position of the inductor assembly within the transmission case, oil spray and splash may be influenced by both gravitational forces and vehicle pitch and roll angles, which may cause less fluid to contact the inductor assembly and reduce cooling.

SUMMARY

In an embodiment, a vehicle is provided with a vehicle electrical system with a variable voltage converter (VVC) and an inductor assembly. The inductor assembly has a core and a winding. A bobbin is connected to and surrounds an outer perimeter of the inductor assembly. The bobbin defines an inlet, an internal fluid passage, and a series of nozzles. The nozzles in the series of nozzles are spaced apart from one another about the bobbin and are positioned to spray fluid directly onto the winding. A fluid system is connected to the inlet to provide pressurized fluid to the inlet.

In another embodiment, a vehicle power electronics assembly is provided with an inductor assembly having a core and a winding, a mounting bracket directly connected to at least one of the winding and the core of the inductor assembly, and a bobbin directly connected to at least one of the inductor assembly and the mounting bracket. The bobbin surrounds an outer perimeter of the winding of inductor assembly. The bobbin defines an inlet, an internal fluid passage, and a series of nozzles, the nozzles in the series of nozzles are spaced apart from one another about the bobbin and are positioned to spray fluid directly onto the winding. Each nozzle in the series of nozzles has a flow guide extending outwardly therefrom. The flow guide is adjacent to an outlet region of the associated nozzle. The flow guide of each nozzle is shaped such that spray from the associated nozzle extends over an angular spray range of 90 to 180 degrees.

In yet another embodiment, a method for providing and cooling an inductor assembly is provided. A winding is provided about a core to form an inductor assembly. At least one mounting bracket is connected to the core of the inductor assembly. A bobbin is formed with a central aperture sized to receive the winding of the inductor assembly. The bobbin is formed to define an inlet, an internal fluid passage surrounding the central aperture, and a series of nozzles. The nozzles in the series of nozzles are spaced apart from one another about the bobbin. The inductor assembly is positioned within the aperture of the bobbin such that the bobbin surrounds an outer perimeter of the winding of the inductor assembly. The bobbin is directly connected to at least one of the inductor assembly and the mounting bracket. Pressurized fluid is provided to the inlet in response to a current of the inductor assembly being above a threshold value such that each nozzle in the series of nozzles sprays pressurized fluid directly onto the winding and/or the core.

DETAILED DESCRIPTION

As required, detailed embodiments of the present disclosure are provided herein; however, it is to be understood that the disclosed embodiments are merely examples and may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present disclosure.

Figure 1:
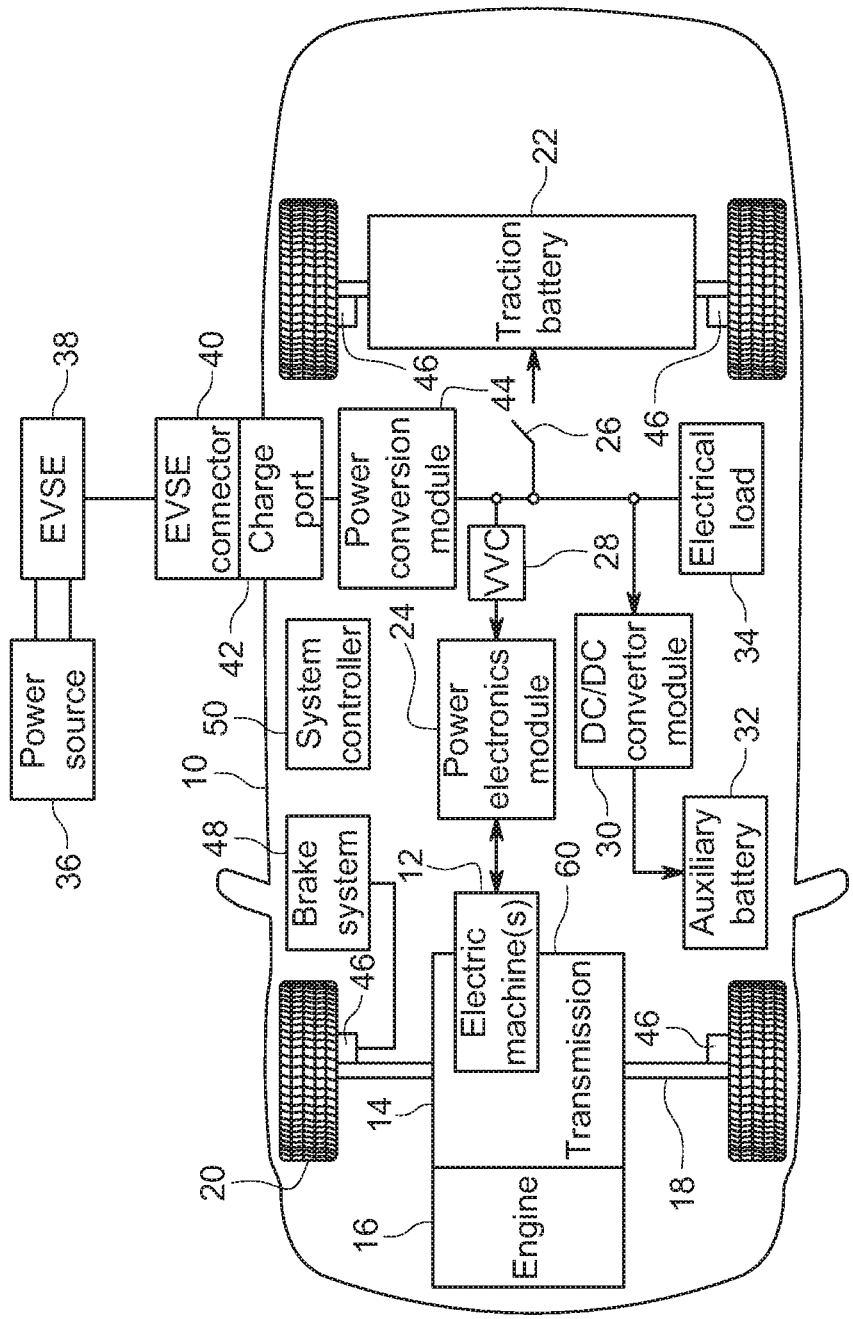
FIG. 1 illustrates a schematic of a vehicle according to an embodiment.

FIG. 1 illustrates a schematic of an electrified vehicle 10 that may be referred to as a plug-in hybrid-electric vehicle (PHEV). A plug-in hybrid-electric vehicle may comprise one or more electric machines 12 mechanically coupled to a hybrid transmission 14. The electric machines 12 may be capable of operating as a motor or a generator. In addition, the hybrid transmission 14 is mechanically coupled to an engine 16. The hybrid transmission 14 is also mechanically coupled to a drive shaft 18 that is mechanically coupled to the wheels 20. The electric machines 12 can provide propulsion and braking capability when the engine 16 is turned on or off. The electric machines 12 may also act as generators and can provide fuel economy benefits by recovering energy that would normally be lost as heat in a friction braking system. The electric machines 12 may also reduce vehicle emissions by allowing the engine 16 to operate at more efficient speeds and allowing the hybrid-electric vehicle 10 to be operated in electric mode with the engine 16 off under certain conditions. An electrified vehicle 10 may also be a battery electric vehicle (BEV). In a BEV configuration, the engine 16 may not be present. In other configurations, the electrified vehicle 10 may be a full hybrid-electric vehicle (FHEV) without plug-in capability, a micro-hybrid vehicle, a start-stop vehicle, or the like.

A traction battery or battery pack 22 stores energy that can be used by the electric machines 12. The vehicle battery pack 22 may provide a high voltage direct current (DC) output. The traction battery 22 may be electrically coupled to one or more power electronics modules 24. One or more contactors 26 may isolate the traction battery 22 from other components when opened and connect the traction battery 22 to other components when closed. The power electronics module 24 is also electrically coupled to the electric machines 12 and provides the ability to bi-directionally transfer energy between the traction battery 22 and the electric machines 12. For example, a traction battery 22 may provide a DC voltage while the electric machines 12 may operate with a three-phase alternating current (AC) to function. The power electronics module 24 may convert the DC current to a three-phase AC current to operate the electric machines 12. In a regenerative mode, the power electronics module 24 may convert the three-phase AC current from the electric machines 12 acting as generators to the DC current compatible with the traction battery 22.

The vehicle 10 may include a variable-voltage converter (VVC) 28 electrically coupled between the traction battery 22 and the power electronics module 24. The VVC 28 may be a DC/DC boost converter configured to increase or boost the voltage provided by the traction battery 22, or buck the voltage provided to the traction battery. By increasing the voltage, current requirements may be decreased leading to a reduction in wiring size for the power electronics module 24 and the electric machines 12. Further, the electric machines 12 may be operated with better efficiency and lower losses.

In addition to providing energy for propulsion, the traction battery 22 may provide energy for other vehicle electrical systems. The vehicle 10 may include a DC/DC converter module 30 that converts the high voltage DC output of the traction battery 22 to a low voltage DC supply that is compatible with low-voltage vehicle loads. An output of the DC/DC converter module 30 may be electrically coupled to an auxiliary battery 32 (e.g., 12V battery) for charging the auxiliary battery 32. The low-voltage systems may be electrically coupled to the auxiliary battery 32. One or more electrical loads 34 may be coupled to the high-voltage bus.

The electrical loads 34 may have an associated controller that operates and controls the electrical loads 34 when appropriate. Examples of electrical loads 34 may be a fan, an electric heating element and/or an air-conditioning compressor.

The electrified vehicle 10 may be configured to recharge the traction battery 22 from an external power source 36. The external power source 36 may be a connection to an electrical outlet. The external power source 36 may be electrically coupled to a charger or electric vehicle supply equipment (EVSE) 38. The external power source 36 may be an electrical power distribution network or grid as provided by an electric utility company. The EVSE 38 may provide circuitry and controls to regulate and manage the transfer of energy between the power source 36 and the vehicle 10. The external power source 36 may provide DC or AC electric power to the EVSE 38. The EVSE 38 may have a charge connector 40 for plugging into a charge port 42 of the vehicle 10. The charge port 42 may be any type of port configured to transfer power from the EVSE 38 to the vehicle 10. The charge port 42 may be electrically coupled to a charger or on-board power conversion module 44. The power conversion module 44 may condition the power supplied from the EVSE 38 to provide the proper voltage and current levels to the traction battery 22. The power conversion module 44 may interface with the EVSE 38 to coordinate the delivery of power to the vehicle 10. The EVSE connector 40 may have pins that mate with corresponding recesses of the charge port 42. Alternatively, various components described as being electrically coupled or connected may transfer power using a wireless inductive coupling.

One or more wheel brakes 46 may be provided for braking the vehicle 10 and preventing motion of the vehicle 10. The wheel brakes 46 may be hydraulically actuated, electrically actuated, or some combination thereof. The wheel brakes 46 may be a part of a brake system 48. The brake system 48 may include other components to operate the wheel brakes 46. For simplicity, the figure depicts a single connection between the brake system 48 and one of the wheel brakes 46, and connections between the brake system 48 and the other wheel brakes 46 are implied. The brake system 48 may include a controller to monitor and coordinate the brake system 48. The brake system 48 may monitor the brake components and control the wheel brakes 46 for vehicle braking. The brake system 48 may respond to driver commands and may also operate autonomously to implement features such as stability control. The controller of the brake system 48 may implement a method of applying a requested brake force when requested by another controller or sub-function.

Electronic modules in the vehicle 10 may communicate via one or more vehicle networks. The vehicle network may include a plurality of channels for communication. One channel of the vehicle network may be a serial bus such as a Controller Area Network (CAN). One of the channels of the vehicle network may include an Ethernet network defined by Institute of Electrical and Electronics Engineers (IEEE) 802 family of standards. Additional channels of the vehicle network may include discrete connections between modules and may include power signals from the auxiliary battery 32. Different signals may be transferred over different channels of the vehicle network. For example, video signals may be transferred over a high-speed channel (e.g., Ethernet) while control signals may be transferred over CAN or discrete signals. The vehicle network may include any hardware and software components that aid in transferring signals and data between modules. The vehicle network is not shown in FIG. 1 but it may be implied that the vehicle network may connect to any electronic module that is present in the vehicle 10. A vehicle system controller (VSC) 50 may be present to coordinate the operation of the various components.

It is recognized that any circuit or other electrical device disclosed herein may include any number of microprocessors, integrated circuits, memory devices (e.g., FLASH, random access memory (RAM), read only memory (ROM), electrically programmable read only memory (EPROM), electrically erasable programmable read only memory (EEPROM), or other suitable variants thereof) and software which co-act with one another to perform operation(s) disclosed herein. In addition, any one or more of the electrical devices as disclosed herein may be configured to execute a computer-program that is embodied in a non-transitory computer readable medium that is programmed to perform any number of the functions as disclosed herein.

The transmission 14 has a case or housing 60, and the gearsets for the transmission 14 are contained within the case 60. The transmission 14 may be an automatic transmission, or another transmission as is known in the art. The transmission 14 may contains sets of meshed gears and clutches to provide various gear ratios for the vehicle 10. Additionally or alternatively, the transmission 14 may contain one or more planetary gearsets, which may function as a continuously variable transmission. Furthermore, the transmission 14 may include a torque converter in addition to or in place of one or more clutches.

As the transmission 14 operates, the transmission may require cooling and/or lubrication. As such, the transmission 14 has an associated fluid system that contains a transmission fluid. The fluid system is not shown in FIG. 1, but can be understood with later reference to FIG. 3. The transmission fluid system includes valves, pumps and conduits for circulating the fluid through the transmission housing 60. The transmission 14 includes a heat exchanger or automatic transmission fluid cooler for cooling the transmission fluid. The transmission may be configured as a wet sump system that stores the fluid in sump or pan at the bottom of the transmission. Alternatively, the transmission may be configured as a dry sump transmission that stores the fluid in a separate tank or reservoir, with the sump or pan at the bottom of the housing being kept in a dry or semi-dry state. When the transmission operates, rotating elements such as gears and shafts may displace or splash transmission fluid onto other components within the transmission housing 60.

Figure 2:
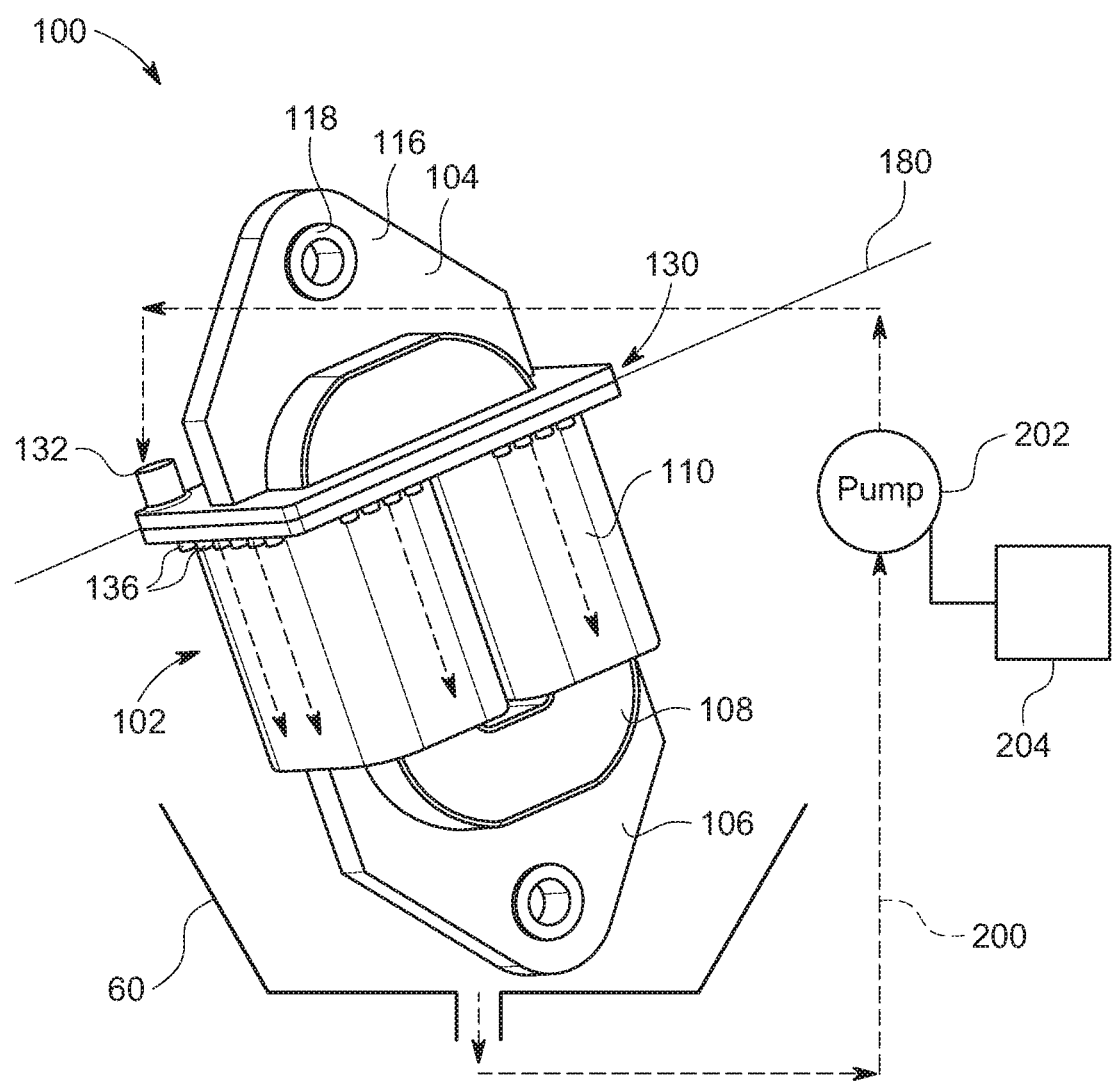
FIG. 2 illustrates a perspective view of a vehicle power electronics assembly and a schematic view of a fluid system according to an embodiment.
Figure 3:
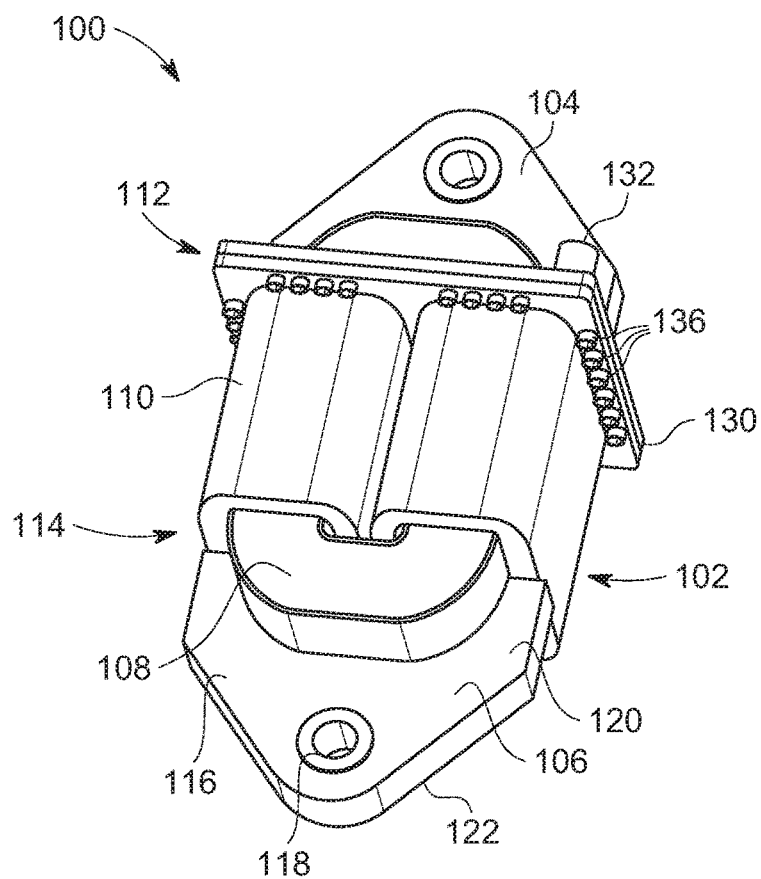
FIG. 3 illustrates another perspective view of the vehicle power electronics assembly of FIG. 2.

FIGS. 2-3 illustrate a perspective view of a vehicle power electronics assembly 100. The vehicle power electronics assembly 100 has an inductor assembly 102 and mounting brackets 104, 106 according to an embodiment. The inductor assembly 102 may also be referred to or be incorporated into a variable voltage converter (VVC) 28 or other vehicle power electronics system as described above with respect to FIG. 1. The VVC 28 may include any number of switches, transistors, diodes, and the like, which may be mounted in a separate location from the inductor assembly, and be in electrical communication with the inductor assembly. Note that FIG. 1 is a schematic view of the vehicle 10, and the components may be otherwise positioned or arranged within the vehicle.

The inductor assembly 102 may be mounted within a transmission case 60 as shown above in FIG. 1, such that it is in an interior wet region of the housing 60. In other examples, the inductor assembly 102 may be mounted outside the transmission case 60 and at another location on a structural vehicle component in the vehicle 10. The transmission case 60 or vehicle component provides the structure to support the inductor assembly 102 on the vehicle 10.

The inductor assembly 102 may be provided as a ferromagnetic-core type inductor. As current is supplied to the inductor assembly 102, a magnetic flux is generated. When the current flowing through the inductor assembly 102 changes, a time-varying magnetic field is created, and a voltage is induced. The inductor assembly 102 may have power losses that contribute to generation of heat during operation. The current capability of the inductor assembly 102 may be limited by the temperature or thermal performance of the inductor assembly. Thermal management and/or cooling of the inductor assembly may dissipate heat, and improve inductor performance and efficiency.

The inductor assembly 102 is illustrated according to an embodiment and includes a core 108 and a winding 110. The core 108 may be formed from one or more sections. In one example, the core 108 is formed from at least two sections, e.g. as two C-shaped sections. In other example, a greater number of core sections may be used. The core sections may collectively form a ring-shaped element. Air gaps, ceramic spacers, adhesive, and the like may be positioned between adjacent core sections. The core 108 may be formed from a magnetic material, such as a ferromagnetic material.

The winding 110 may be formed as a pair of tubular or helical coils, with each coil surrounding a portion of the core 108. The winding 110 may be formed from a conductive material, such as copper or aluminum. Input and output leads (not shown) extend from the winding 110 and connect to other components of the VVC. An insulator (not shown) may be positioned between the core 108 and the winding 110.

First and second mounting brackets 104, 106 are illustrated as being connected to the inductor assembly 102. The first and second mounting brackets 104, 106 provide a mechanical support to the inductor assembly 102, and facilitate positioning and fixation of the inductor assembly 102 to a vehicle component, such as the transmission housing 60.

The first mounting bracket 104 is connected to a first end region 112 of the inductor assembly. The second mounting bracket 106 is connected to a second end region 114 of the inductor assembly. The second end region 114 of the inductor assembly is opposite to the first end region 112. In other examples, the mounting brackets 104, 106 and/or their associated apertures may be otherwise shaped or oriented. Each mounting bracket 104, 106 may be formed as a plate 116, with an aperture 118 therethrough. The aperture 118 may be reinforced with a metal bushing or sleeve. Each of the mounting brackets 104, 106 may be formed with a first face 120 and a second face 122 opposite to the first face, and the first and second faces 120, 122 may be planar. The aperture 118 may be used with a fastener to connect the inductor assembly 102 to a mounting boss or the like of the vehicle component. In further examples, the two mounting brackets 104, 106 may be integrally formed as a single component to extend circumferentially around the inductor assembly 102 and to the outside of the winding 110.

In the example shown, the first and second mounting brackets 104, 106 are directly connected to the core 108. In one example, the mounting brackets 104, 106 may be formed from a plastic material, such as a via an injection molding process, for example, from a thermoplastic such as polyphenylene sulfide (PPS). In further examples, the mounting brackets 104, 106 may be formed using an injection molding process, and may be directly molded onto the core 108 of the inductor assembly, or may be formed and then attached to the core 108 via an adhesive or the like.

Figure 4:
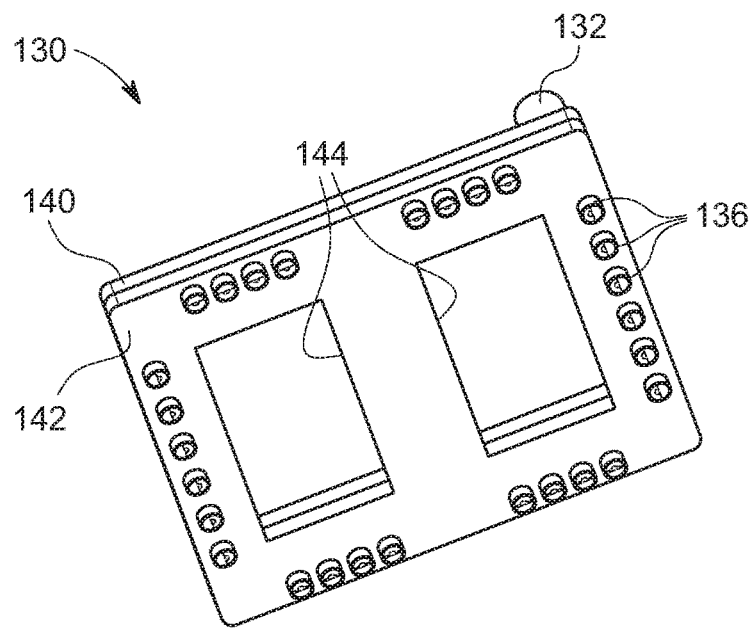
FIG. 4 illustrates a perspective view of a bobbin for use with the vehicle power electronics system of FIG. 2 according to an embodiment.

FIGS. 2-4 illustrate a bobbin 130 for use with the inductor assembly 102 and vehicle power electronics assembly 100 of FIG. 2 with a fluid system 200. In one example, the inductor assembly 102, bobbin 130, and fluid system 200 may be used with the vehicle 10 of FIG. 1.

The bobbin 130 is positioned about the inductor assembly 102 or a portion thereof. The bobbin 130 is connected to the inductor assembly 102, and surrounds at least a portion of an outer perimeter of the inductor assembly. In the example shown, the bobbin 130 surrounds an entirety of the outer perimeter of the inductor assembly 102.

The bobbin 130 defines an inlet 132, an internal fluid passage 134, and a series of nozzles 136. The nozzles in the series of nozzles 136 are spaced apart from one another about the bobbin 130. The series of nozzles 136 are positioned to spray fluid directly onto the winding 110 and/or the core 108. The nozzles 136 are described in greater detail with respect to FIGS. 7-10.

The bobbin 130 may be directly connected to the inductor assembly 102, for example, directly connected to the core 108. In another example, the bobbin 130 may be directly connected to one of the mounting brackets 104, 106, and be positioned adjacent to the inductor assembly 102.

Figure 5:
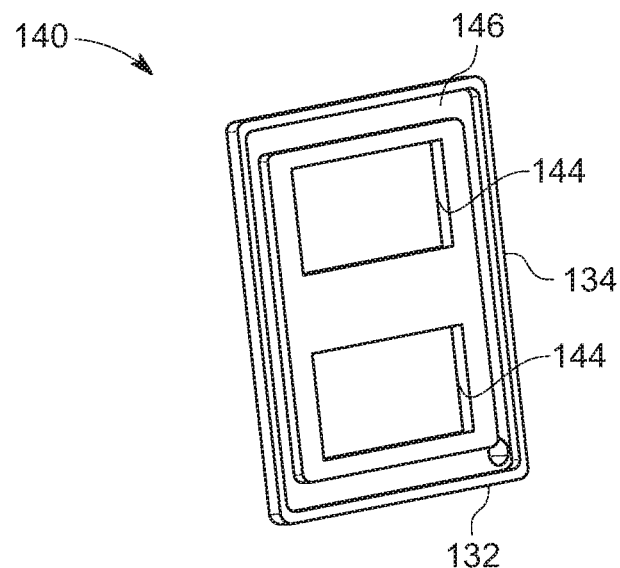
FIG. 5 illustrates a perspective view of a first housing member for the bobbin of FIG. 4.
Figure 6:
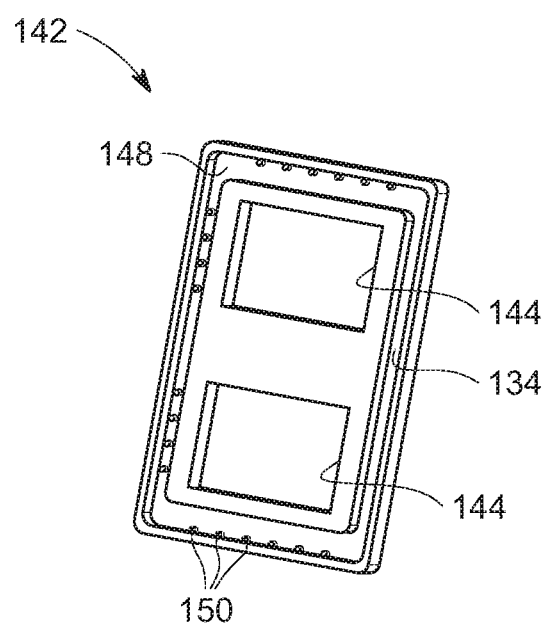
FIG. 6 illustrates a perspective view of a second housing member for the bobbin of FIG. 4.

As shown in FIGS. 4-6, the bobbin 130 has a first housing member 140 and a second housing member 142 mating with the first housing member. The first housing member 140 is shown in FIG. 5, and the second housing member 142 is shown in FIG. 6.

The first and second housing members 140, 142 cooperate to surround an outer perimeter of the winding 110 and the core 108 of the inductor assembly. In the example shown, the first and second housing members 140, 142 surround an entirety of the outer perimeter of the winding 110 and the core 108. The bobbin 130 may be positioned adjacent to one end of the inductor assembly 102, such as the first end region 112.

Each of the housing members 140, 142 defines at least one central aperture 144 sized to receive the winding 110 of the inductor assembly 102. The internal fluid passage 134 surrounds the aperture(s) 144. The inductor assembly 102 is positioned within the aperture(s) of the bobbin 130 such that the bobbin 130 surrounds an outer perimeter of the winding 110 of the inductor assembly.

According to one example, the first housing member 140 defines the inlet 132. The second housing member 142 defines the series of nozzles 136 or provides support for the series of nozzles as inserts into apertures defined by the housing member. In other examples, either the first housing member 140 or the second housing member 142 may define both the inlet 132 and the series of nozzles 136, or apertures therefor.

The first and second housing member 140, 142 each define a channel 146, 148 therein, respectively, such that the first housing member 140 and second housing member 142 cooperate to define the internal fluid passage 134. In other examples, only one of the first and second housing members 140, 142 defines a channel, and the other of the housing members 142, 140 defines a planar or other surface to enclose the channel and define the passage 134.

The internal fluid passage 134 may extend around at least a portion of the perimeter region of bobbin 130 and inductor assembly 102. In the example shown, the channels 146, 148 and internal fluid passage 134 continuously surrounds the entirety of the perimeter region of the bobbin 130 and of the outer perimeter region of the inductor assembly 102. In the example shown, the internal fluid passage 134 additionally extends along or lies within a plane transverse to the inductor assembly 102.

In one example, the first housing member 140 and the second housing member 142 of the bobbin 130 are formed from plastic, such as a via an injection molding process, for example, from a thermoplastic such as polyphenylene sulfide (PPS). In further examples, the housing members 140, 142 may be formed using an injection molding process, and may be directly molded onto the inductor assembly or one of the mounting brackets, or may be formed and then attached to the inductor assembly or one of the mounting brackets via an adhesive or the like.

The series of nozzles 136 may be formed from a plastic or a metal. In one example, the series of nozzles are formed from plastic and are integrally formed with one of the housing members, e.g. during the same injection molding process.

In another example, at least one of the housing members 140, 142 is formed with a series of apertures 150, and the series of nozzles 136 are formed separately from the associated housing member and then connected to the housing member. For example, the series of nozzles 136 may be formed from a metal. The series of nozzles 136 may be inserted into the apertures 150 of the housing member, and connected to the housing member via an interference fit, a screw connection, an adhesive, or the like. In another example, the housing member may be injection molded about the series of nozzles.

Figure 7:
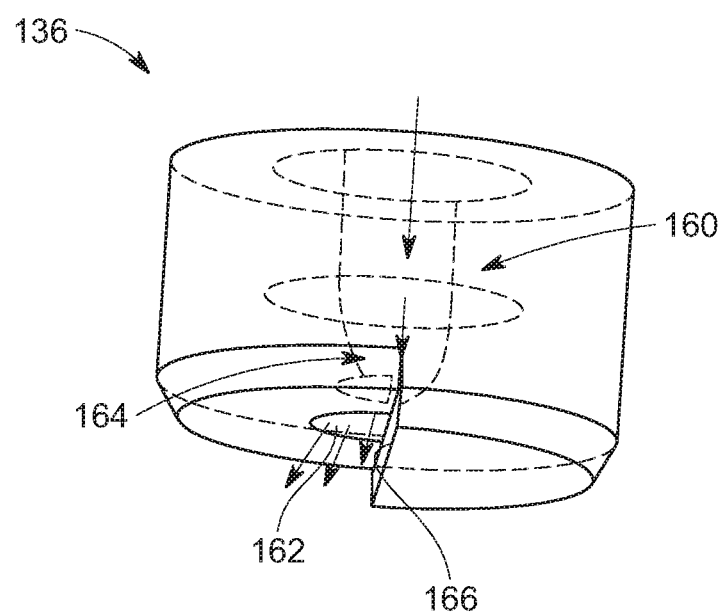
FIG. 7 illustrates a perspective view of a nozzle for use with the bobbin of FIG. 4 according to an embodiment.
Figure 8:
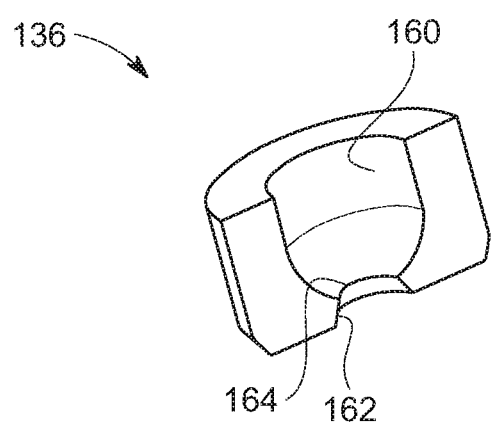
FIG. 8 illustrates a perspective section view of the nozzle of FIG. 7.
Figure 9:
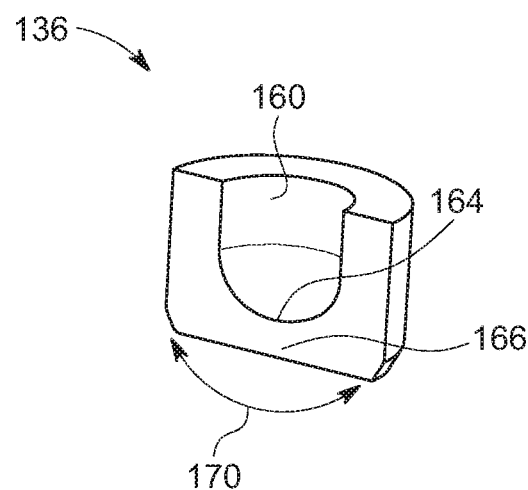
FIG. 9 illustrates another perspective section view of the nozzle of FIG. 7.

As shown in FIGS. 7-9, each nozzle in the series of nozzles 136 defines an inlet region 160, an outlet region 162, and a constricted section 164 or throat between the inlet and outlet regions 160, 162. The shape of the nozzle 136 therefore forms a venturi. A cross-sectional area of the constricted section 164 is less than a cross-sectional area of the inlet region 160. Similarly, the cross-sectional area of the constricted section 164 is less than a cross-sectional area of the outlet region 162.

Each nozzle in the series of nozzles 136 has a flow guide 166 extending outwardly therefrom, with the flow guide 166 being adjacent to an outlet region 162 of the associated nozzle. The flow guide 166 be provided as a planar or otherwise shaped surface or wall, and may resemble a step according to one example The flow guide 166 may extend to be parallel to or substantially parallel to the central axis of the nozzle 136.

Figure 10:
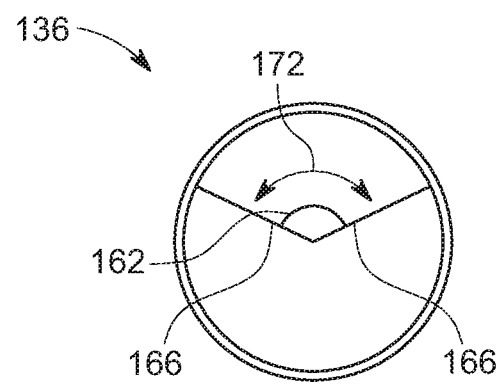
FIG. 10 illustrates an end view of a nozzle for use with the bobbin of FIG. 4 according to another embodiment.

In various examples, the flow guide 166 of each nozzle is shaped such that spray from the associated nozzle extends over an angular spray range of 0 to 180 degrees, 0 to 120 degrees in a further example, or an angular spray range of 0 to 90 degrees in an even further example. In other examples, the flow guide 166 of each nozzle is shaped such that spray from the associated nozzle extends over an angular spray range of 90 to 180 degrees, 120 to 180 degrees in a further example, or 150 to 180 degrees in an even further example. The flow guide 166 as shown in FIGS. 7-9 is shaped such that spray from the associated nozzle extends over a spray angle 170 of 180 degrees. FIG. 10 illustrates a perspective view of a nozzle for use with the series of nozzles 136 according to another example, and with a flow guide 166 shaped such that spray from the associated nozzle extends over a spray angle 172 of 120 degrees.

The nozzles in the series of nozzles 136 may be identical to one another in terms of geometry. In other examples, the nozzles in the series of nozzles 136 may be different than one another, for example, with the nozzles have different spray angles. In one example, the flow guide 166 of a first nozzle in the series of nozzles is shaped such that spray from the first nozzle extends over a first spray angle, such as spray angle 170, and the flow guide 166 of a second nozzle in the series of nozzles is shaped such that spray from the second nozzle extends over a second spray angle, such as spray angle 172. The second spray angle 172 is less than the first spray angle 180. For example, the first nozzle may have a spray angle 170 of 180 degrees as shown in FIGS. 7-9, and the second nozzle may have a spray angle 172 of 120 degrees as shown in FIG. 10. In other example, combination of other nozzles 136 with varying spray angles is also contemplated.

According to one embodiment, the cross-sectional shape of the inlet 160 of the nozzles may be circular. The cross-sectional shape of the outlet 162 of the nozzle may be non-circular, and may be provided as a sector of a circle, e.g. a semi-circle for a 180 spray angle, and the like. The cross-sectional shape of the constricted section 164 may be circular or a sector of a circle.

The internal fluid passage 134 and nozzles 136 may be provided to provide direct fluid spray and flow onto each side of the inductor assembly 102 or winding 110, e.g. the front, back, left, and right sides as shown in the Figures. The nozzles 136 are each oriented such that the spray angle is towards the winding 110 and inductor assembly 102.

The nozzles in the series of nozzles 136 may be positioned along each side of the bobbin 130 to be equally spaced with respect to one another. The spacing between adjacent nozzles 136 may be dependent on the spray angle for the nozzles. As the spray angle decreases, the spacing between the nozzles 136 likewise decreases.

According to an embodiment, and as shown, the first and second housing members 140, 142 are shaped to mate to one another along a plane 180 transverse to the inductor assembly 102, and extending through the core 108 and both of the windings 110 as shown in FIG. 2. In other examples, the first and second housing members 140, 142 may mate or join along another plane, or may be complexly shaped such that they do not join along a plane.

As the fluid flow enters the inlet 132, the fluid flows through the internal fluid passage 134 around the bobbin 130. At each nozzle 136, a portion of the fluid flow leaves the passage 134, flows through the associated nozzle 136, and onto the inductor assembly 102. The constricted section 164 of the nozzle accelerates the flow, and the flow guide 166 directs the flow towards the inductor assembly 102. As the fluid flow is in direct contact with the winding 110 and/or core 108 of the inductor assembly, heat transfer from the inductor assembly 102 to the fluid is increased via both convective and conductive heat transfer pathways.

As shown in FIG. 2, a fluid system 200 is connected to the inlet 132 to provide pressurized fluid to the inlet 132 and internal fluid passage 134 of the bobbin. An electric pump 202 may be provided in the fluid system 200 to pressurize the fluid. The fluid system 200 may be an open loop system as shown.

According to a further example, the fluid system 200 is in fluid communication with or fluidly connected to the transmission 14 fluid system, such that the fluid in the fluid system 200 is transmission fluid. For an open loop system fluidly connected to the transmission 14, the pump 202 of the fluid system 200 receives fluid from a sump or other reservoir in the transmission case 60, directs pressurized fluid to the inlet 132 of the bobbin 130. The nozzles 136 open into an interior region of the transmission case 60 such that the fluid flows out of the nozzles 136, onto the inductor assembly 102, and then into the sump of the housing 60. Additional elements such as a heat exchanger, valves, filters and the like may be provided in the system 200.

For a vehicle power electronics assembly 100 positioned inside a transmission case 60, fluid flow from each nozzle of the series of nozzles 136 of the bobbin 130 drains directly into the interior of the transmission case 60. Alternatively, the power electronics assembly 100 may be provided in another casing or housing for the vehicle that contains a coolant or lubricant.

The pump 202 may be an electrically operated pump, e.g. connected to an electric motor, such that the pump may be operated to circulate fluid independent of the transmission or driveline state.

A controller 204 is in communication with the pump 202, and the controller 204 may be provided as a separate pump controller, or may be provided as another vehicle controller, such as a transmission control unit, an electronics or electrical power controller, or another vehicle system controller 50. The controller 204 is configured to operate the pump 202 to circulate fluid through the bobbin 130 to cool the inductor assembly 102.

In one example, the controller 204 controls the pump 202 to provide pressurized fluid to the inlet 132 in response to a current through the inductor assembly 102 being above a threshold value. The threshold value may be zero, or may be a value other than zero. In other words, the controller 204 may control the pump 202 to circulate fluid through the inductor assembly 102 in response to the inductor assembly 102 operating.

In another example, the controller 204 controls the pump 202 to provide pressurized fluid to the inlet 132 in response to a current through the inductor assembly 102 being above a threshold value, and in response to the motor speed being below a threshold value or the transmission input shaft speed being below a threshold value. The threshold value may be zero, or may be a value other than zero. In other words, the controller 204 may control the pump 202 to circulate fluid through the inductor assembly 102 in response to the inductor assembly 102 operating and the motor having a low speed or zero speed. When the motor is running above the threshold value, e.g., at a middle or high speed, fluid may be splashed directly onto the inductor assembly 102 outer surface from the transmission gear train to cool the inductor without use of spray from the nozzles 136 in the bobbin 130.

In one example, the inductor assembly 102 and bobbin 130 may be positioned such that the inlet 132 is positioned above the nozzles 136. As such, flow of the fluid through the nozzles 136 is further assisted and directed by gravity. "Generally" as used herein refers to being within twenty degrees, ten degrees, or five degrees of the stated orientation. In other examples, and with sufficient pressure of the fluid at the inlet, the inlet 132 and nozzles 136 may be otherwise oriented relative to one another.

By cooling the inductor assembly 102 with spray from the nozzles 136, the pressurized fluid flow and velocity is sufficiently high so as to direct fluid onto the inductor assembly 102 and overcome forces imparted onto the fluid based on changes in vehicle pitch or roll while driving, and maintain cooling effectiveness. Unlike the assembly 100 according to the present disclosure, a conventional method of cooling using fluid splash from the gearing may be impacted by changes in vehicle pitch and roll angles and gravitational forces.

By use of a pressurized spray via the nozzle 136 design as disclosed herein, the fluid spray velocity is increased, and the spray angle is controlled. As such, the fluid is sprayed directly onto the inductor 102 surfaces, which increases cooling of the inductor assembly 102, increases the inductor current capability, and also lowers the power rating and cost for the pump 202.

While exemplary embodiments are described above, it is not intended that these embodiments describe all possible forms of the invention or disclosure. Rather, the words used in the specification are words of description rather than limitation, and it is understood that various changes may be made without departing from the spirit and scope of the disclosure. Additionally, the features of various implementing embodiments may be combined to form further embodiments of the invention or disclosure.

What is claimed is:

1. A vehicle comprising:
   a vehicle electrical system with a variable voltage converter (VVC) and an inductor assembly, the inductor assembly having a core and a winding;
   a bobbin connected to and surrounding an outer perimeter of the inductor assembly, the bobbin defining an inlet, an internal fluid passage, and a series of nozzles, the nozzles in the series of nozzles are spaced apart from one another about the bobbin and positioned to spray fluid directly onto the winding; and
   a fluid system connected to the inlet to provide pressurized fluid to the inlet;
   wherein the bobbin has a first housing member and a second housing member mating with the first housing member; and
   wherein at least one of the first housing member and the second housing member defines a channel therein such that the first housing member and second housing member cooperate to define the internal fluid passage.

2. The vehicle of claim 1 wherein each nozzle in the series of nozzles has a flow guide extending outwardly therefrom, the flow guide being adjacent to an outlet region of the associated nozzle.

3. The vehicle of claim 2 wherein the flow guide of each nozzle is shaped such that spray from the associated nozzle extends over an angular spray range of 120 to 180 degrees.

4. The vehicle of claim 2 wherein the flow guide of each nozzle is shaped such that spray from the associated nozzle extends over an angular spray range of 150 to 180 degrees.

5. The vehicle of claim 2 wherein the flow guide of a first nozzle in the series of nozzles is shaped such that spray from the first nozzle extends over a first spray angle; and
   wherein the flow guide of a second nozzle in the series of nozzles is shaped such that spray from the second nozzle extends over a second spray angle, the second spray angle being less than the first spray angle.

6. The vehicle of claim 2 wherein each nozzle in the series of nozzles defines an inlet region, an outlet region, and a constricted section between the inlet and outlet regions, wherein a cross-sectional area of the constricted section is less than a cross-sectional area of the inlet region, and wherein the cross-sectional area of the constricted section is less than a cross-sectional area of the outlet region.

7. The vehicle of claim 1 wherein the internal fluid passage continuously surrounds the outer perimeter of the inductor assembly.

8. The vehicle of claim 1 wherein the internal fluid passage extends along a plane transverse to the inductor assembly.

9. The vehicle of claim 1 wherein the first housing member defines the inlet; and
   wherein the second housing member defines the series of nozzles.

10. The vehicle of claim 1 wherein the first housing member and the second housing member of the bobbin are formed from plastic; and
    wherein each nozzle in the series of nozzles is formed from metal.

11. The vehicle of claim 1 further comprising a mounting bracket connected to the inductor assembly, the mounting bracket defining an aperture therethrough to connect the inductor assembly to the vehicle.

12. The vehicle of claim 11 wherein the bobbin is connected to the mounting bracket.

13. The vehicle of claim 12 wherein the mounting bracket is a first mounting bracket, and is connected to a first end region of the inductor assembly; and
    wherein the vehicle comprises a second mounting bracket connected to a second end region of the inductor assembly, the second end region of the inductor assembly being opposite to the first end region, the second mounting bracket defining an aperture therethrough to connect the inductor assembly to the vehicle.

14. The vehicle of claim 1 further comprising a transmission with a transmission case;
    wherein fluid in the fluid system is a transmission fluid circulated within the transmission case; and
    wherein the inductor assembly is positioned inside an interior of the transmission case.

15. The vehicle of claim 14 wherein fluid flow from each nozzle of the series of nozzles of the bobbin drains directly into the interior of the transmission case.

16. The vehicle of claim 1 wherein the fluid system has an electrically driven pump; and
    wherein the vehicle further comprises a controller configured to, in response to a current of the inductor assembly being above a threshold value, operate the pump to cool the inductor assembly.

17. A vehicle power electronics assembly comprising:
    an inductor assembly having a core and a winding;
    a mounting bracket directly connected to at least one of the winding and the core of the inductor assembly; and
    a bobbin directly connected to at least one of the inductor assembly and the mounting bracket, the bobbin surrounding an outer perimeter of the winding of inductor assembly, the bobbin defining an inlet, an internal fluid passage, and a series of nozzles, the nozzles in the series of nozzles are spaced apart from one another about the bobbin and positioned to spray fluid directly onto the winding;
    wherein each nozzle in the series of nozzles has a flow guide extending outwardly therefrom, the flow guide being adjacent to an outlet region of the associated nozzle, the flow guide of each nozzle shaped such that spray from the associated nozzle extends over an angular spray range of 90 to 180 degrees;
    wherein the bobbin has a first housing member and a second housing member mating with the first housing member; and
    wherein at least one of the first housing member and the second housing member defines a channel therein such that the first housing member and second housing member cooperate to define the internal fluid passage.

18. The vehicle power electronics assembly of claim 17 wherein the flow guide of a first nozzle in the series of nozzles is shaped such that spray from the first nozzle extends over a first spray angle; and
    wherein the flow guide of a second nozzle in the series of nozzles is shaped such that spray from the second nozzle extends over a second spray angle, the second spray angle being less than the first spray angle.

19. A vehicle comprising:

a vehicle electrical system with a variable voltage converter (VVC) and an inductor assembly, the inductor assembly having a core and a winding;

a bobbin connected to and surrounding an outer perimeter of the inductor assembly, the bobbin defining an inlet, an internal fluid passage, and a series of nozzles, the nozzles in the series of nozzles are spaced apart from one another about the bobbin and positioned to spray fluid directly onto the winding; and a fluid system connected to the inlet to provide pressurized fluid to the inlet;

wherein each nozzle in the series of nozzles has a flow guide extending outwardly therefrom, the flow guide being adjacent to an outlet region of the associated nozzle;

wherein the flow guide of a first nozzle in the series of nozzles is shaped such that spray from the first nozzle extends over a first spray angle; and wherein the flow guide of a second nozzle in the series of nozzles is shaped such that spray from the second nozzle extends over a second spray angle, the second spray angle being less than the first spray angle.

* * * * *